(12) United States Patent
Kim et al.

(10) Patent No.: US 8,909,972 B2
(45) Date of Patent: Dec. 9, 2014

(54) LATENCY CONTROL CIRCUIT AND METHOD OF CONTROLLING LATENCY

(75) Inventors: Kyung Hoon Kim, Icheon-si (KR); Hong Bae Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 750 days.

(21) Appl. No.: 13/219,620

(22) Filed: Aug. 27, 2011

(65) Prior Publication Data

US 2012/0194240 A1   Aug. 2, 2012

(30) Foreign Application Priority Data

Jan. 28, 2011   (KR) .................. 10-2011-0009075

(51) Int. Cl.
*G06F 1/00*   (2006.01)
*H03L 7/06*   (2006.01)
(52) U.S. Cl.
CPC ........................................ *H03L 7/06* (2013.01)
USPC ....................................................... 713/500
(58) Field of Classification Search
CPC ............................................................ G11C 7/22
USPC ....................................................... 713/500
See application file for complete search history.

(56) References Cited

U.S. PATENT DOCUMENTS 7,317,657 B2 *   1/2008   Brox et al. ................. 365/233.1
7,404,018 B2 *   7/2008   Dietrich et al. ................. 710/52

FOREIGN PATENT DOCUMENTS

KR   100829455 B1   5/2008
KR   100834401 B1   5/2008
KR   10-0931026 B1   12/2009

* cited by examiner

*Primary Examiner* — Dennis M Butler
*Assistant Examiner* — Alyaa T Mazyad
(74) *Attorney, Agent, or Firm* — William Park & Associates Patent Ltd.

(57) ABSTRACT

A latency control circuit includes: a delay locked loop (DLL) configured to generate a DLL clock signal by delaying a clock signal by a delay time varied according to any one of dual locking points, and generate a loop change signal according to a locking point change; a control unit configured to generate a latency control signal in response to a reset signal, a delay signal generated by delaying the reset signal by a first delay time, and the loop change signal; and a latency signal generation unit configured to adjust a latency of a command signal in response to the latency control signal and output a latency signal.

27 Claims, 13 Drawing Sheets

LATENCY CONTROL CIRCUIT AND METHOD OF CONTROLLING LATENCY

CROSS-REFERENCES TO RELATED APPLICATION

The present application claims priority under 35 U.S.C. §119(a) to Korean application number 10-2011-0009075, filed on Jan. 28, 2011, in the Korean Intellectual Property Office, which is incorporated herein by reference in its entirety.

BACKGROUND

1. Technical Field

The present invention relates generally to a semiconductor circuit, and more particularly, to controlling latency in a semiconductor device.

2. Related Art

A CAS latency (CL) in a data read operation generally refers to the number of clock cycles counted from the input of the read command to the output of the first data. That is, the CAS latency (CL) is a time interval from the input of a read command, which is synchronized with an external clock signal, to the output of the first data through a DQ pin.

In addition, there is a delay time associated with a data output path in a semiconductor circuit, which should also be taken into consideration.

The delay characteristics of a replica delay for compensating the delay time in a data output path may be changed, depending on the power supply voltage variations.

Therefore, the latency associated with a delay time in a data output path as well as the CAS latency should be addressed in a semiconductor circuit.

SUMMARY

An embodiment of the present invention is directed to provide a latency control circuit and method that can exactly control a latency defined in an operation specification and a data output latency by compensating a variation in a delay time of a data output path.

In an embodiment of the present invention, a latency control circuit includes: a delay locked loop (DLL) configured to generate a DLL clock signal by delaying a clock signal by a delay time varied according to any one of dual locking points, and generate a loop change signal according to a locking point change; a control unit configured to generate a latency control signal in response to a reset signal, a delay signal generated by delaying the reset signal by a first delay time, and the loop change signal; and a latency signal generation unit configured to adjust a latency of a command signal in response to the latency control signal and output a latency signal.

Further, a latency control method according an embodiment of the present invention using a delay locked loop configured to operate according to a dual locking point and generate a loop change signal according to a locking point change includes: setting a latency value according to a reset signal, a delay signal generated by delaying the reset signal by a set time, and a loop change signal; and adjusting a latency of a command signal according to the latency value.

BRIEF DESCRIPTION OF THE DRAWINGS

Features, aspects, and embodiments are described in conjunction with the attached drawings, in which:

FIG. 6 is an operation timing diagram of the pulse generation section shown in FIG. 5;

FIG. 8 is a circuit diagram of the delay line shown in FIG. 7;

DETAILED DESCRIPTION

Hereinafter, a latency control circuit and method of controlling latency according to an embodiment of the present invention will be described below with reference to the accompanying drawings through exemplary embodiments.

A latency control circuit 10 according to an embodiment of the present invention will be described below with reference to FIGS. 1 through 3.

Figure 1:
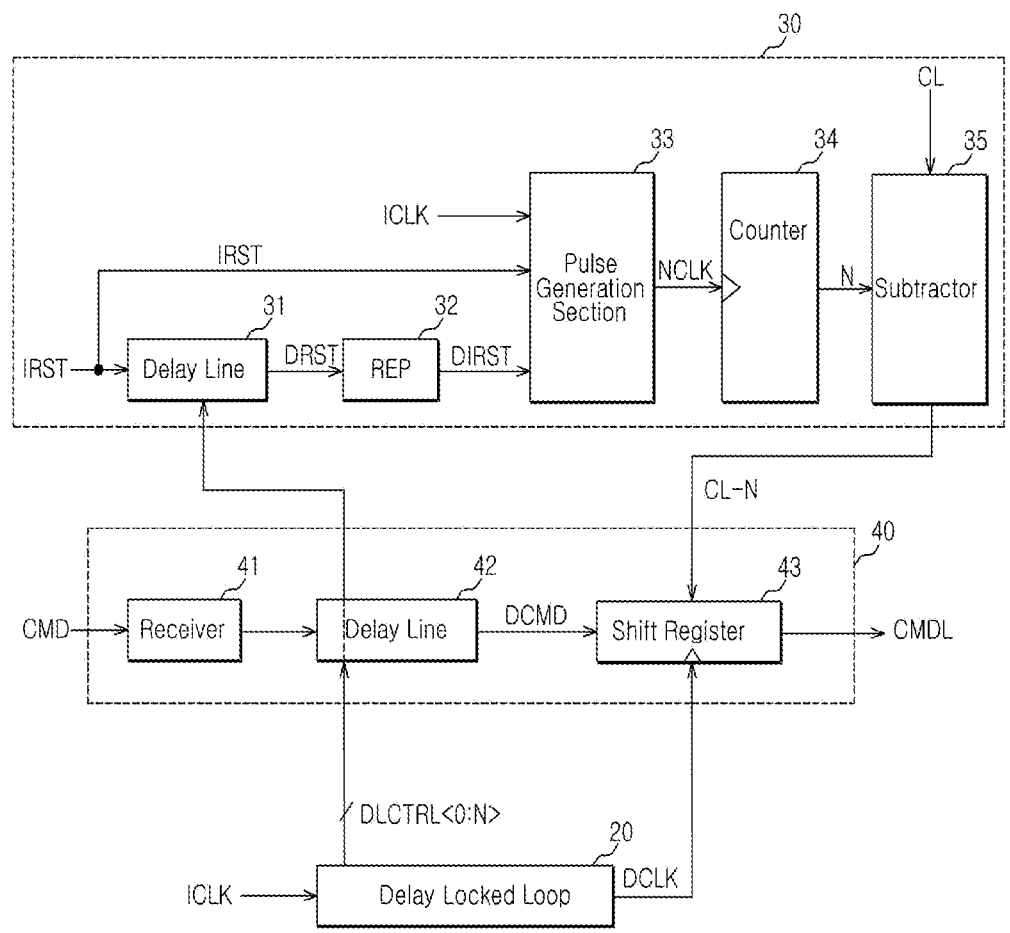
FIG. 1 is a block diagram of a latency control circuit according to an embodiment of the present invention.

Referring to FIG. 1, a latency control circuit 10 according to an embodiment of the present invention includes a delay locked loop (DLL) 20, a control unit 30, and a latency signal generation unit 40.

The delay locked loop 20 may comprise a general delay locked loop and may be configured to generate a DLL clock signal DCLK by delaying a clock signal ICLK by a delay time varied in response to a delay line control signal DLCTRL<0:N> generated according to a phase comparison result of a clock signal ICLK and a feedback signal (not shown).

The control unit 30 is configured to generate a latency control signal CL-N by operating a CAS latency CL and a phase difference value of a reset signal IRST and a delay signal DIRST, which is generated by delaying the reset signal IRST by a first delay time.

The control unit 30 includes a delay line 31, a replica delay 32, a pulse generation section 33, a counter 34, and a subtractor 35.

The sum of the delay time in the delay line 31 and the delay time of the replica delay 32 corresponds to the first delay time.

The delay line 31 is configured to delay the reset signal IRST by a delay time varied in response to the delay line control signal DLCTRL<0:N>.

The replica delay 32 is configured to delay an output signal DRST of the delay line 31 by a delay time replicating a delay time of a data output path.

The pulse generation section 33 is configured to output a pulse of the clock signal ICLK, which is included in a phase difference period of the reset signal IRST and the delay signal DIRST outputted from the replica delay 32, as a counting pulse NCLK.

The counter 34 is configured to output a counting result of the counting pulse NCLK as a latency adjustment signal N.

The subtractor 35 is configured to subtract the latency adjustment signal N from the CAS latency CL and output the subtraction result as a latency control signal CL-N.

The latency signal generation unit 40 is configured to adjust a latency of a command signal CMD in response to the latency control signal CL-N and output a latency signal CMDL.

The latency signal generation unit 40 includes a receiver 41, a delay line 42, and a shift register 43.

The receiver 41 is configured to receive the command signal CMD.

The delay line 42 is configured to delay the command signal CMD received through the receiver 41 by a delay time, which is varied in response to the delay line control signal DLCTRL.

The shift register 43 is configured to generate the latency signal CMDL by shifting the output signal DCMD of the delay line 42 in response to the DLL clock signal DCLK and the latency control signal CL-N.

The delay lines 31 and 42 may be substantially same in structure as a delay line (not shown) in the delay locked loop 20.

Figure 2:
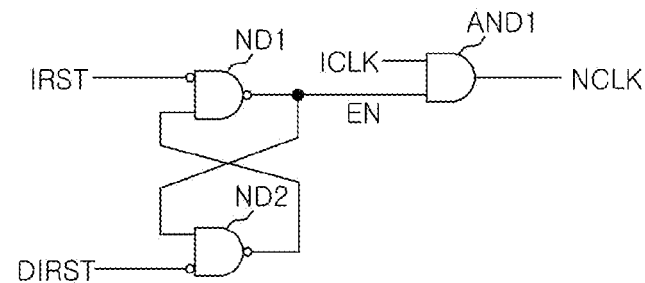
FIG. 2 is a circuit diagram of a pulse generation section shown in FIG. 1.

Referring to FIG. 2, the pulse generation section 33 includes NAND gates ND1 and ND2 and an AND gate AND1.

Figure 3:
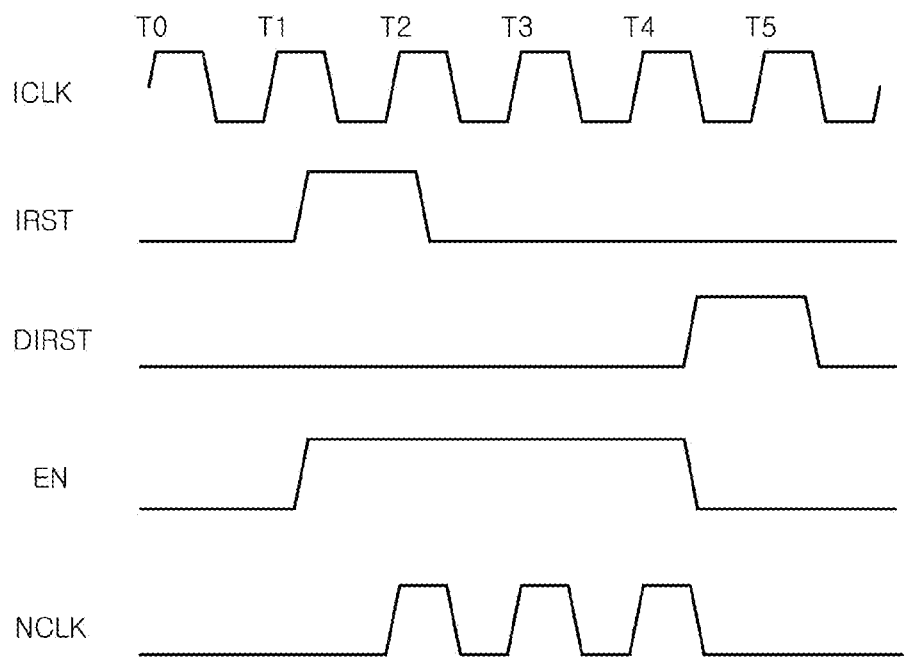
FIG. 3 is an operation timing diagram of the pulse is generation section shown in FIG. 2.

Referring to FIG. 3, the pulse generation section 33 generates an enable signal EN in response to the reset signal IRST and the delay signal DIRST.

The pulse generation section 33 performs an AND operation on the enable signal EN and the clock signal ICLK and outputs pulses of the clock signal ICLK, which are included in an activation period of the enable signal EN, as the counting pulse NCLK.

A latency control circuit 11 with varied features according to an embodiment of the present invention will be described below with reference to FIGS. 4 through 15.

Figure 4:
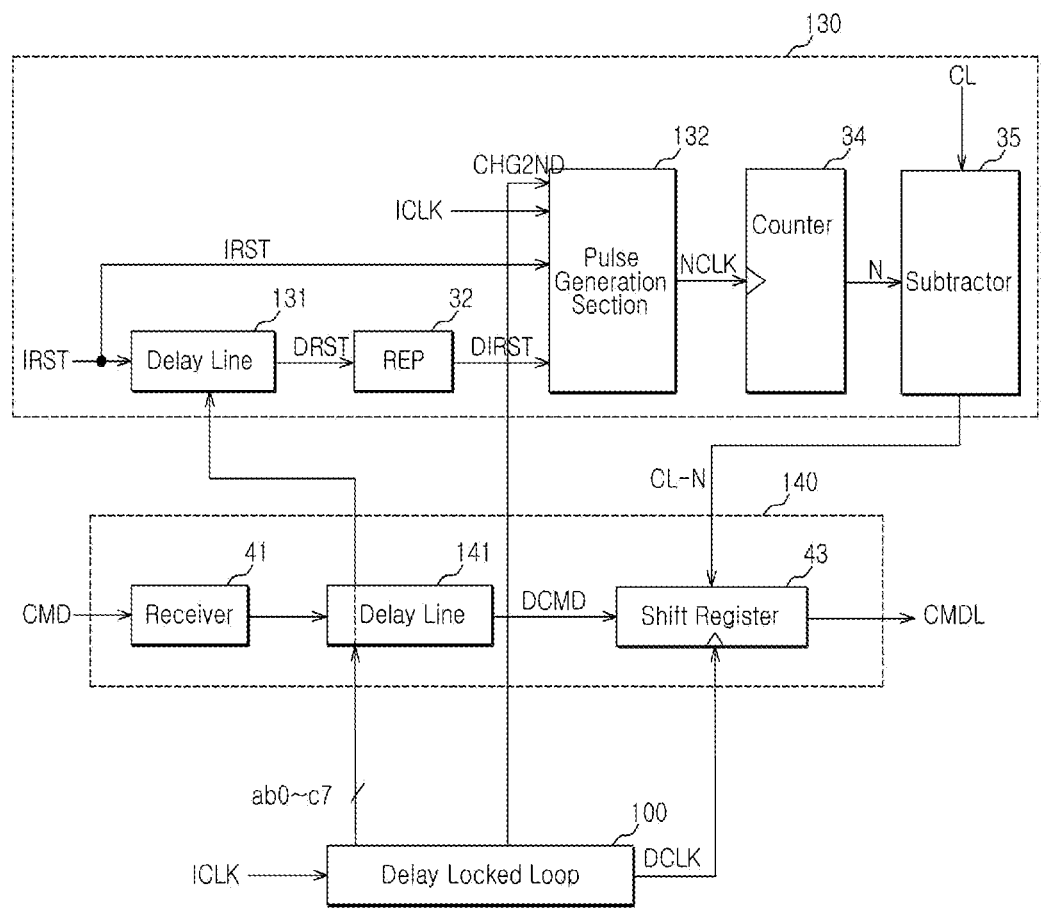
FIG. 4 is a block diagram of a latency control circuit of varied features according to an embodiment of the present invention.

Referring to FIG. 4, a latency control circuit 11 according to an embodiment of the present invention includes a delay locked loop 100, a control unit 130, and a latency signal generation unit 140.

The delay locked loop 100 may be a dual locking type delay locked loop.

The delay locked loop 100 is configured to perform a primary locking through a first loop, that is, a primary delay locking operation, and perform a secondary locking to find a locking point having a 1tCK phase difference from the first locking point through a second loop when there is a decrease of more than a delay due to variations in the power supply voltage or others.

The delay locked loop 100 is configured to output delay line control signals ab0 through c7 that are used to control the delay line during the locking process.

The delay locked loop 100 is configured to output a loop change signal CHG2ND.

The loop change signal CHG2ND is a signal that determines a loop change timing. That is, the loop change signal CHG2ND is a signal that determines a timing to change the delay time of the delay line in the delay locked loop 100 to a delay time varied according to the secondary locking.

The delay locked loop 100 generates the DLL clock signal DCLK by delaying the clock signal ICLK by the delay time, which is varied in response to the delay line control signals ab0 through c7, and outputs the DLL clock signal DCLK.

The structure and operation of the delay locked loop 100 will be described below with reference to FIGS. 7 through 15.

The control unit 130 is configured to generate the latency control signal CL-N in response to the reset signal IRST, the delay signal DIRST generated by delaying the reset signal IRST by the first delay time, the loop change signal CHG2ND, and the CAS latency CL.

The control unit 130 may be similar to the control circuit 30 of FIG. 1, but the delay line 131 and the pulse generation section 132 of FIG. 4 may be different from those of FIG. 1.

In this case, the first delay time is equal to the sum of the delay time of the delay line 131 and the delay time of the replica delay 32.

A delay line 131 is configured to delay the reset signal IRST by the delay time varied in response to the delay line control signals ab0 through c7.

A replica delay 32 is configured to delay an output signal DRST of the delay line 131 by a delay time replicating a delay time of a data output path.

A pulse generation section 132 is configured to output a counting pulse NCLK based on a pulse of the clock signal ICLK and the loop change signal CHG2ND, which are included in a phase difference period of the reset signal IRST and the delay signal DIRST outputted from the replica delay 32.

A counter 34 is configured to output a counting result of the counting pulse NCLK as a latency adjustment signal N.

A subtractor 35 is configured to subtract the latency adjustment signal N from the CAS latency CL and output the subtraction result as a latency control signal CL-N.

A latency signal generation unit 140 is configured to adjust a latency of a command signal CMD in response to the latency control signal CL-N and output a latency signal CMDL.

The latency signal generation unit 140 includes a receiver 41, a delay line 141, and a shift register 43.

The receiver 41 is configured to receive the command signal CMD.

The delay line 141 is configured to delay the command signal CMD received through the receiver 41 by a delay time, which is varied in response to the delay line control signals ab0 through c7.

The shift register 43 is configured to generate the latency signal CMDL by shifting the output signal DCMD of the delay line 141 in response to the DLL clock signal DCLK and the latency control signal CL-N.

For example, if CL=8 and N=4, the shift register 43 generates the latency signal CMDL by shifting the output signal DCMD of the delay line 42 by 4 clocks using the DLL clock signal DCLK.

The delay lines 131 and 141 may be substantially same as the delay line (110 in FIG. 8) of the delay locked loop 100.

Figure 5:
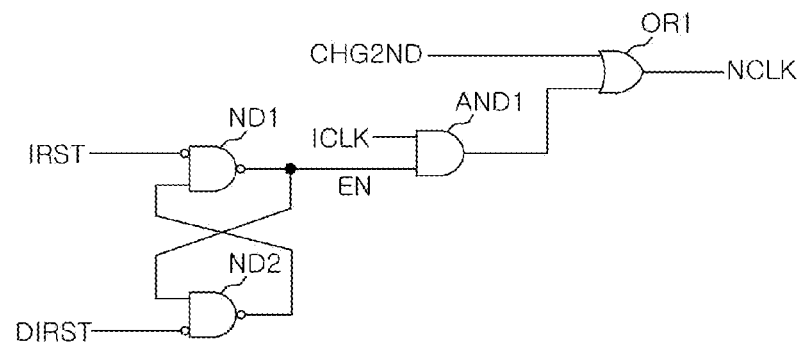
FIG. 5 is a circuit diagram of a pulse generation section shown in FIG. 4.

Referring to FIG. 5, the pulse generation section 132 includes NAND gates ND1 and ND2, an AND gate AND1, and an OR gate OR1.

Figure 6:
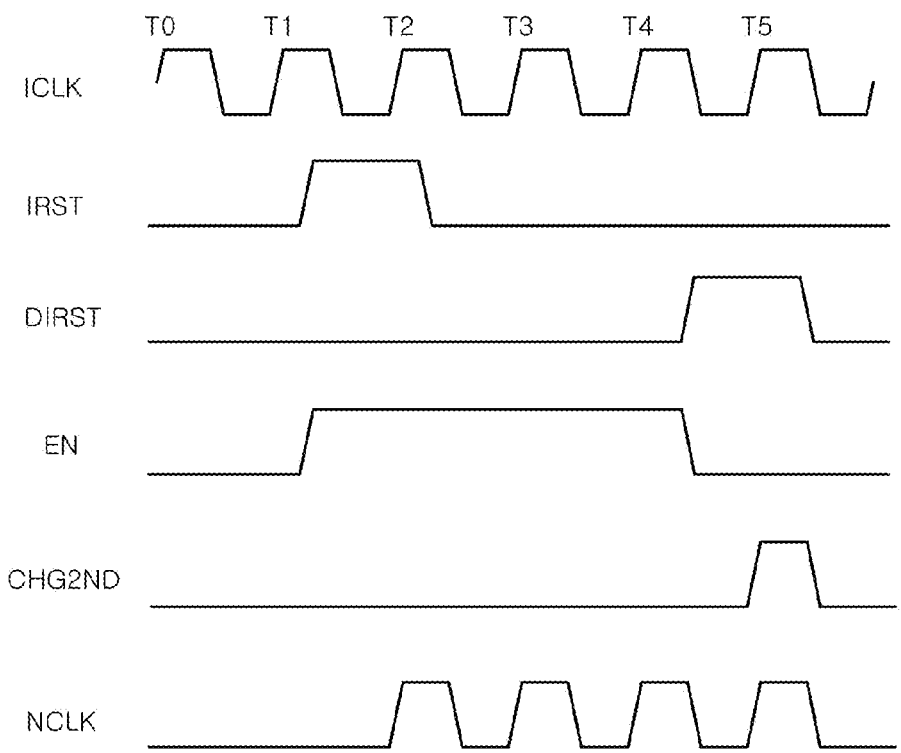
FIG. 6 is an operation timing diagram of the pulse generation section shown in FIG. 4.

Referring to FIG. 6, the pulse generation section 132 is configured to generate an enable signal EN in response to the reset signal IRST and the delay signal DIRST.

The pulse generation section 132 is configured to perform an AND operation on the enable signal EN and the clock signal ICLK and output pulses of the clock signal ICLK included in the activation period of the enable signal EN.

The pulse generation section 132 is configured to perform an OR operation on a pulse of the loop change signal CHG2ND and pulses of the clock signal ICLK included in the activation period of the enable signal EN.

The loop change signal CHG2ND is a signal that determines a timing of changing the delay time of the delay locked loop 100 to the delay time varied according to the secondary locking.

In addition, the delay locked loop 100 is configured to find a locking point having a 1tCK phase difference from the primary locking point and perform a secondary locking.

That is, the locking point of the secondary locking is delayed further than that of the primary locking by 1 tCK, and the loop change signal CHG2ND is generated after the secondary locking. Therefore, the generation of the loop change signal CHG2ND may mean that the locking point is delayed by 1 tCK.

Therefore, in an embodiment of the present invention with respect to FIGS. 4-6, in the case where the loop change signal CHG2ND is generated, the value of the latency adjustment signal N is increased in order to cope with the latency change due to the variation in the power supply voltage or the like, as opposed to the case in which the loop change signal CHG2ND is not generated.

Hereinafter, the delay locked loop 100 of FIG. 4 will be described with reference to FIG. 7.

Figure 7:
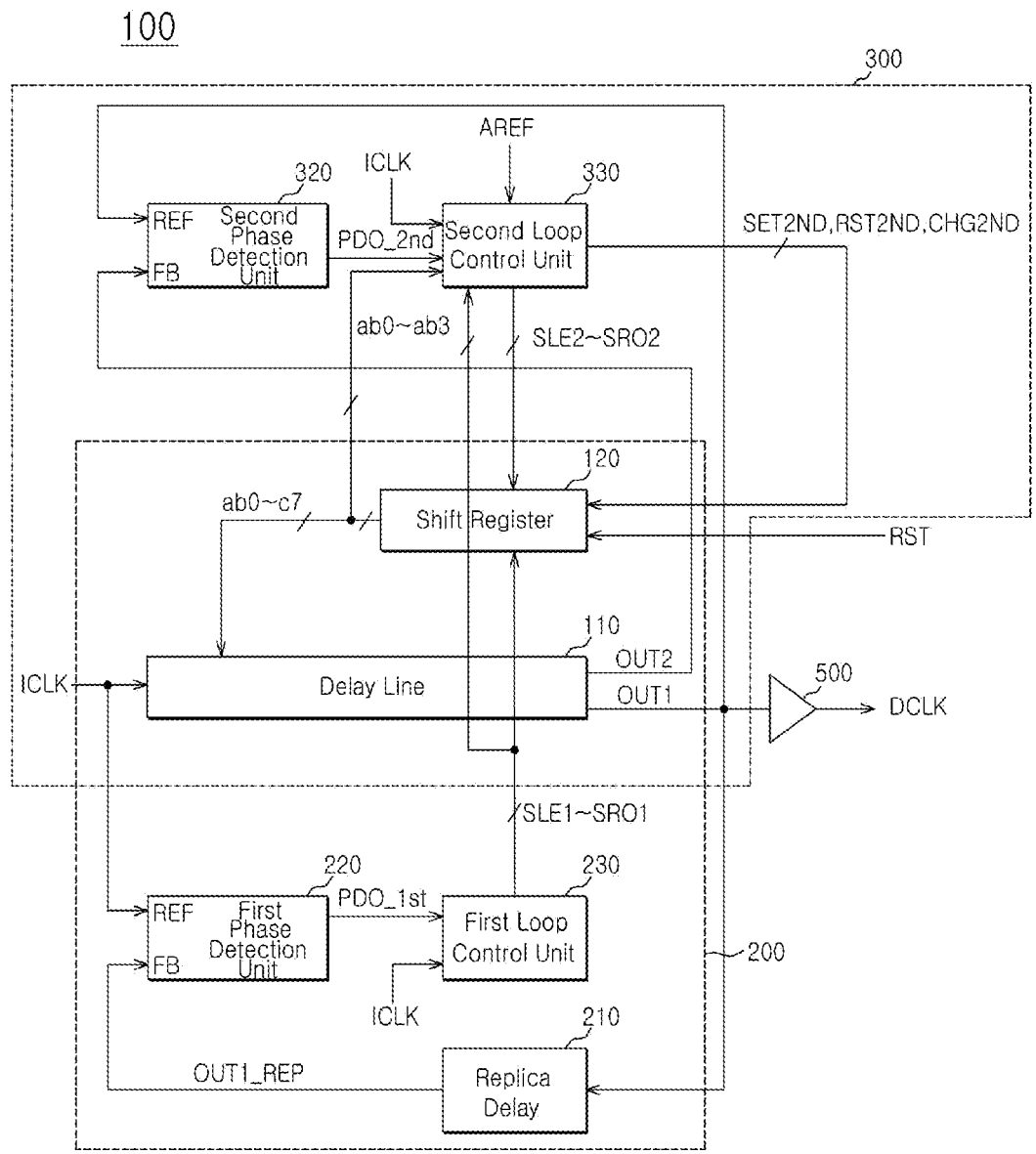
FIG. 7 is a block diagram of a delay locked loop shown in FIG. 4.

Referring to FIG. 7, the delay locked loop 100 includes a first loop 200, a second loop 300, and a driver 500.

The first loop 200 and the second loop 300 are configured to share the shift register 120.

The delay line 110 is configured to generate a first delay signal OUT1 or a second delay signal OUT2 by delaying the clock signal ICLK in response to the delay line control signals ab0 through c7.

The delay line 110 is configured to vary a delay time of the first delay signal OUT1 and vary a delay time of the second delay signal OUT2 in response to the delay line control signals ab0 through c7.

In this case, the delay line control signals ab0, ab1, ab2, . . . , cb7 have logic levels opposite to those of the delay line control signals a0, a1, a2, . . . , c7.

The shift register 120 is configured to generate the delay line control signals ab0 through c7 in response to the reset signal RST, state control signals SET2ND, RST2ND, and CHG2ND, first shift control signals SLE1 through SRO1, and second shift control signals SLE2 through SRO2.

The state control signals designated as SET2ND, RST2ND, and CHG2ND in FIG. 7, among others, are a second loop set signal SET2ND, a second loop reset signal RST2ND, and a loop change signal CHG2ND.

The driver 500 is configured to generate a DLL clock signal DCLK by driving the first delay signal OUT1.

The first loop 200 is configured to perform a primary locking having a locking point at which a phase of the clock signal ICLK is synchronized with a phase of the feedback signal OUT1_REP.

The first loop 200 includes a replica delay 210, a first phase detection unit 220, and a first loop control unit 230.

The replica delay 210 is configured to generate the feedback signal OUT1_REP by delaying the first delay signal OUT1 by the delay time given by modeling the delay time of the data output path of the semiconductor integrated circuit.

The first phase detection unit 220 is configured to compare the phase of the clock signal ICLK with the phase of the feedback signal OUT1_REP and generate a first phase detection signal PDO_1st.

The first loop control unit 230 is configured to generate the first shift control signals SLE1 through SRO1 in response to the first phase detection signal PDO_1st and the clock signal ICLK.

The second loop 300 is configured to perform a secondary locking having a locking point at which the phase of the first delay signal OUT1 is synchronized with the phase of the second delay signal OUT2.

The second loop 300 makes the phase of the second delay signal OUT2 synchronized with the phase of the first delay signal OUT1 at a delay time difference of 1 tCK.

The second loop 300 includes a second phase detection unit 320 and a second loop control unit 330.

The second phase detection unit 320 is configured to compare the phase of the first delay signal OUT1 with the phase of the second delay signal OUT2 and generate the second phase detection signal PDO_2nd.

The second loop control unit 330 is configured to generate second shift control signals SLE2 through SRO2 in response to the second phase detection signal PDO_2nd, the clock signal ICLK, the delay line control signals ab0 through ab3, and the first shift control signals SLE1 through SRO1.

Figure 8:
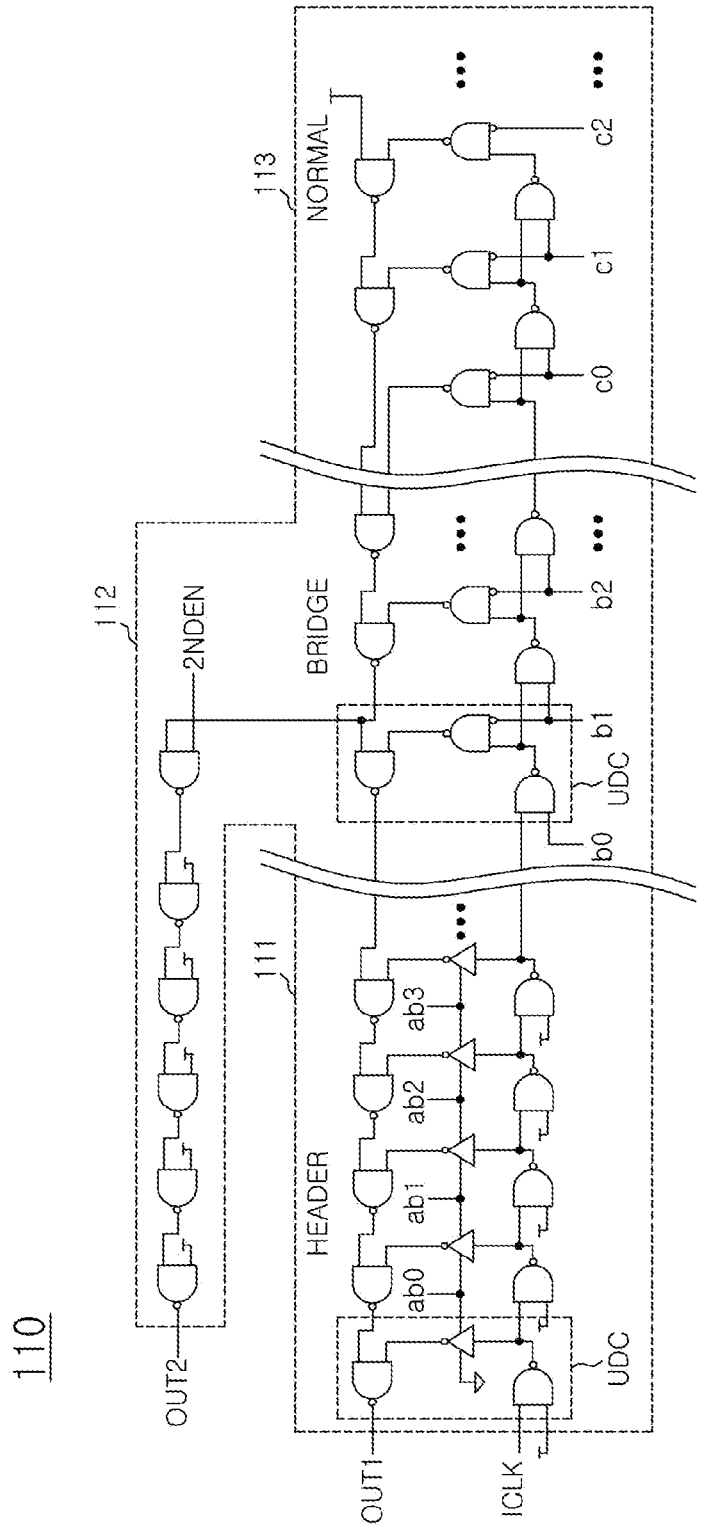
FIG. 8 is a circuit diagram of a delay line shown in FIG. 7.

Referring to FIG. 8, the delay line 110 includes a first delay path, that is, a signal path at which the clock signal ICLK is delayed in the primary locking operation to generate the first delay signal OUT1, and a second delay path, that is, a signal path at which the clock signal ICLK is delayed in the secondary locking operation to generate the second delay signal OUT2.

The first delay path and the second delay path in the delay line 110 partially share some unit delay cells.

The delay line 110 may be divided into first through third delay lines: a header 111, a bridge 112, and a normal 113.

The header 111 is a delay line that is used for the primary locking and is configured to output the first delay signal OUT1.

The bridge 112 is a delay line that is configured to enable the output of the second delay signal OUT2.

The normal 113 is a delay line that is used for the secondary locking.

The header 111 is controlled by the delay line control signals ab0, ab1, ab2, ab3, . . . ; the bridge 112 is controlled by the delay line control signals b0, b1, b2; . . . and the second loop enable signal 2NDEN, and the normal 113 is controlled by the delay line control signals c0, c1, c2, . . . .

The header 111 bypasses the clock signal ICLK as the delay line control signals ab0, ab1, ab2, ab3, . . . become a logic high level.

The unit delay cell UDC of the header 111 in FIG. 8 is configured with a combination of a NAND gate coupled with tri-stage inverter coupled with another NAND gate.

The bridge 112 outputs the clock signal ICLK having passed through the header 111, the bridge 112 and the normal 113 as the second delay signal OUT2 if the second loop enable signal 2NDEN is activated to a logic high level when the delay line control signals b0, b1, b2, . . . are in the activated state of a logic high level.

The unit delay cell of the bridge 112 is configured with a combination of three NAND gates as a NAND gate coupled with a NAND gate and coupled with a NAND gate.

Figure 9:
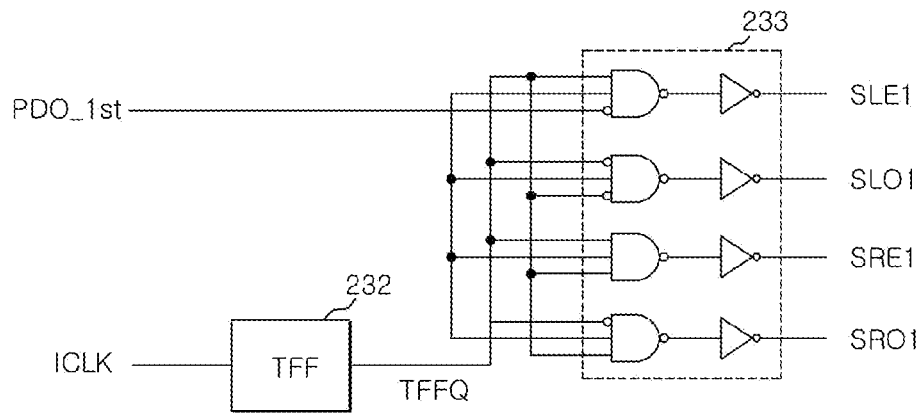
FIG. 9 is a circuit diagram of a first loop control unit shown in FIG. 7.

Referring to FIG. 9, the first loop control unit 230 includes a flip-flop 232 and a decoding logic 233.

The flip-flop 232 may be configured with a T flip-flop and to generate an output signal TFFQ in response to the clock signal ICLK.

The decoding logic 233 is configured to combine the first phase detection signal PDO_1st and the output signal TFFQ and generate the first shift control signals SLE1 through SRO1.

The first shift control signals SLE1 through SRO1 are used to increase or decrease the delay time of the delay line 110.

Figure 10:
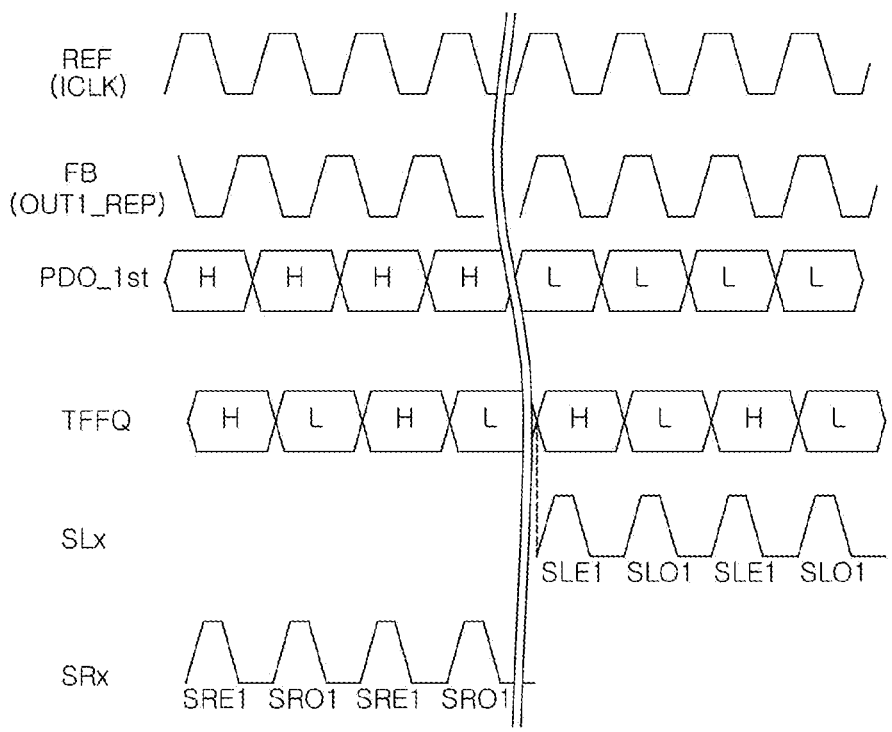
FIG. 10 is an operation timing diagram of the first loop control unit shown in FIG. 9.

Referring to FIG. 10, the first loop control unit 230 repetitively generates the first shift control signals SRE1 and SRO1 using the clock signal ICLK and the output signal TFFQ of the flip-flop 232 when the first phase detection signal PDO_1st is in a logic high level.

The first loop control unit 230 repetitively generates the first shift control signals SLE1 and SLO1 using the clock signal ICLK and the output signal TFFQ of the flip-flop 232 when the first phase detection signal PDO_1st is in a logic low level.

Figure 11:
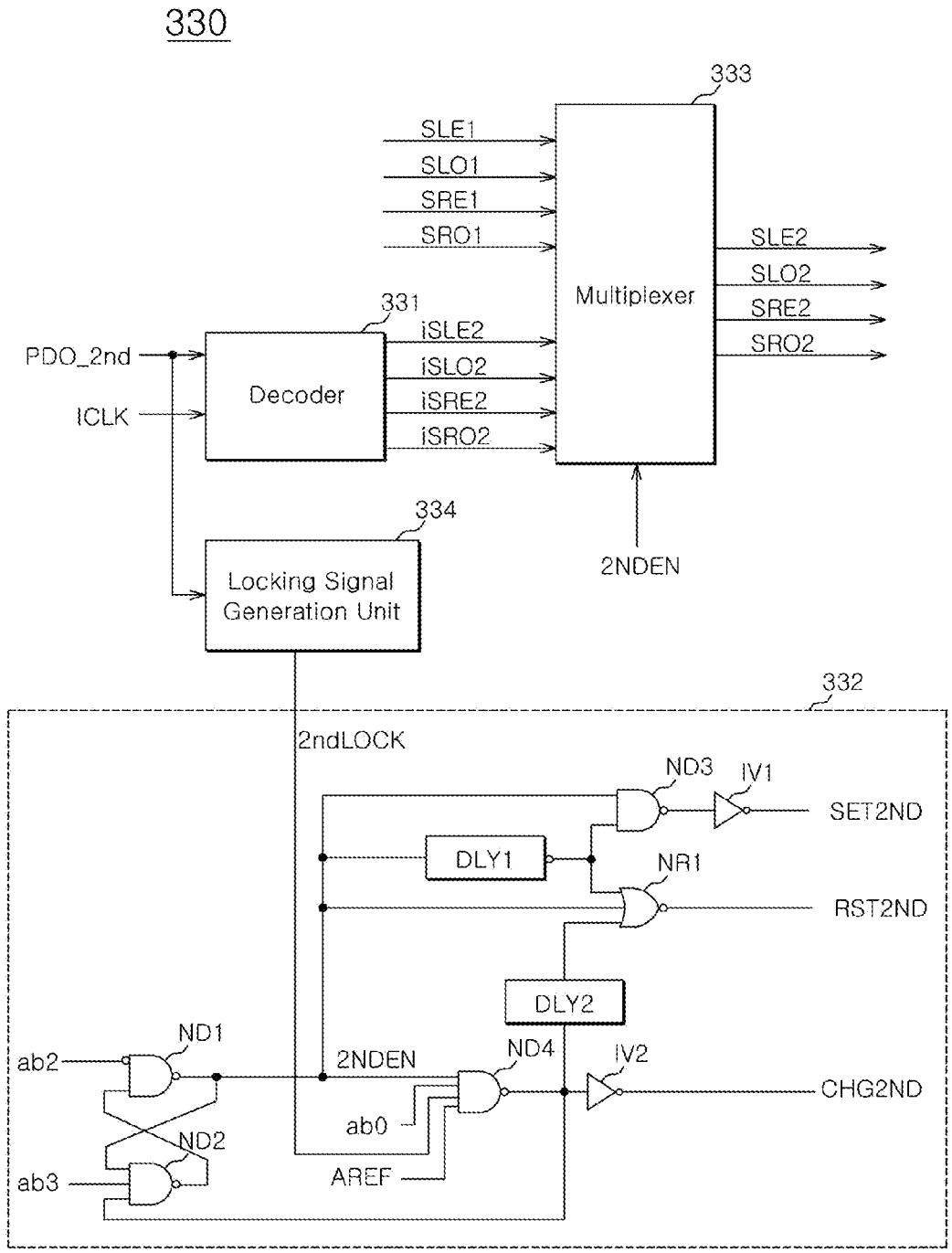
FIG. 11 is a block diagram illustrating the internal structure of a second loop control unit shown in FIG. 7.

Referring to FIG. 11, the second loop control unit 330 includes a decoder 331, a state machine 332, and a multiplexer 333.

The decoder 331 is configured to generate auxiliary shift control signals iSLE2 through iSRO2 in response to the second phase detection signal PDO_2nd and the clock signal ICLK.

The decoder 331 may be configured as substantially similar to the first loop control unit 230.

The multiplexer 333 is configured to output the second shift control signals SLE2 through SRO2 based on the first shift control signals SLE1 through SRO1 and the auxiliary shift control signals iSLE2 through iSRO2 in response to the second loop enable signal 2NDEN.

The locking signal generation unit 334 is configured to activate the second locking signal 2ndLOCK when the second locking point is found, that is, the second phase detection signal PDO_2nd changes to a logic level different from a previous logic level.

The state machine 332 is configured to generate the second enable signal 2NDEN and the state control signals SET2ND, RST2ND and CHG2ND in response to the delay line control signals ab0, ab2 and ab3, the second locking 2ndLOCK, and an auto refresh signal AREF.

The state machine 332 includes NAND gates ND1 through ND4, NOR gate NR1, inverters IV1 and IV2, and delays DLY1 and DLY2. The delay DLY1 is configured to delay and invert an input signal by a set time. Pulse widths of the state control signals are determined by the delay DLY1.

The operation of the state machine 332 will be described below with reference to FIG. 12.

Figure 12:
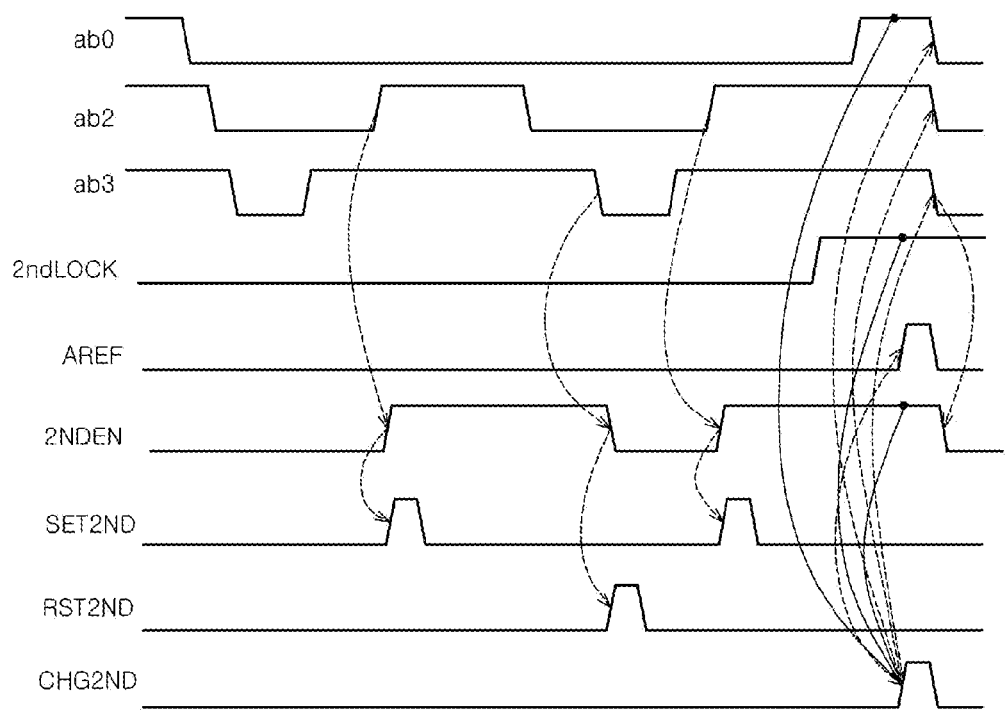
FIG. 12 is an operation timing diagram of a state machine shown in FIG. 11.

Now referring to FIG. 12, when the delay line control signal ab2 becomes a logic high level, the second loop enable signal 2NDEN is activated to a logic high level, and when the delay line control signal ab3 becomes a logic low level, the second loop enable signal 2NDEN is deactivated to a logic low level.

In addition, in a period in which the delay line control signal ab0 is a logic low level and the second loop enable signal 2NDEN is a logic high level, the second loop enable signal 2NDEN is deactivated to a logic low level even when the delay line control signal ab0, the second locking signal 2ndLOCK, and the auto refresh signal AREF is a logic high level.

The delay line control signal ab3 becomes a logic low level periodically in a normal operation and also becomes a logic low level in a reset operation.

As the second loop enable signal 2NDEN is activated to a logic high level, the second loop set signal SET2ND is generated. Accordingly, the second loop 300 of FIG. 3 operates to find the second locking point. When the second locking point is found, the second locking signal 2ndLOCK is activated to a logic high level.

As the second loop enable signal 2NDEN is deactivated to a logic low level, the second loop reset signal RST2ND is generated.

Meanwhile, when the loop change signal CHG2ND is generated, the second loop reset signal RST2ND need not be generated. Therefore, when the delay DLY3 is constructed to generate the loop change signal CHG2ND, the second loop reset signal RST2ND is not generated.

In a period when all of the second loop enable signal 2NDEN, the delay line control signal ab0, the second locking signal 2ndLOCK, and the auto refresh signal AREF are at a logic high level, the loop change signal CHG2ND is also activated to a logic high level.

The loop change signal CHG2ND is a signal that determines a loop change timing. That is, the loop change signal CHG2ND is a signal that determines a timing for changing the delay time of the delay line 110 to a delay time locked by the second loop 300. Accordingly, even though there is a glitch caused by the loop change contained in the DLL clock signal DCLK, an operation period (e.g., an auto refresh operation) that does not influence the operation of the semiconductor circuit should be preferred. Therefore, under a condition that activates the loop change signal CHG2ND to a logic high level, the auto refresh signal AREF generated according to a non-read series command, e.g., an auto refresh command, may be used.

As the loop change signal CHG2ND becomes a logic high level, the second loop enable signal 2NDEN is deactivated to a logic low level.

Figure 13A:
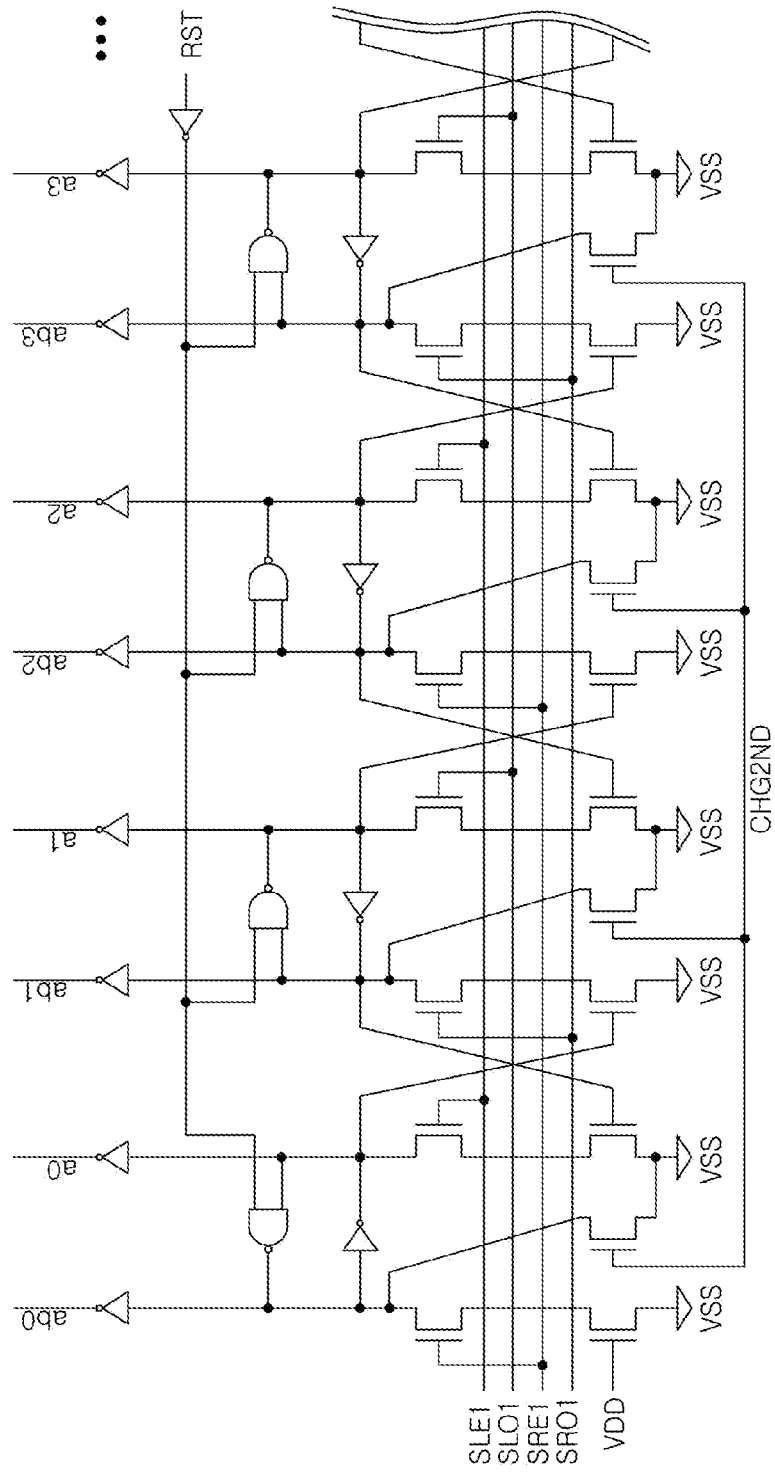
FIGS. 13A through 13C are circuit diagrams of a shift register shown in FIG. 7.
Figure 13B:
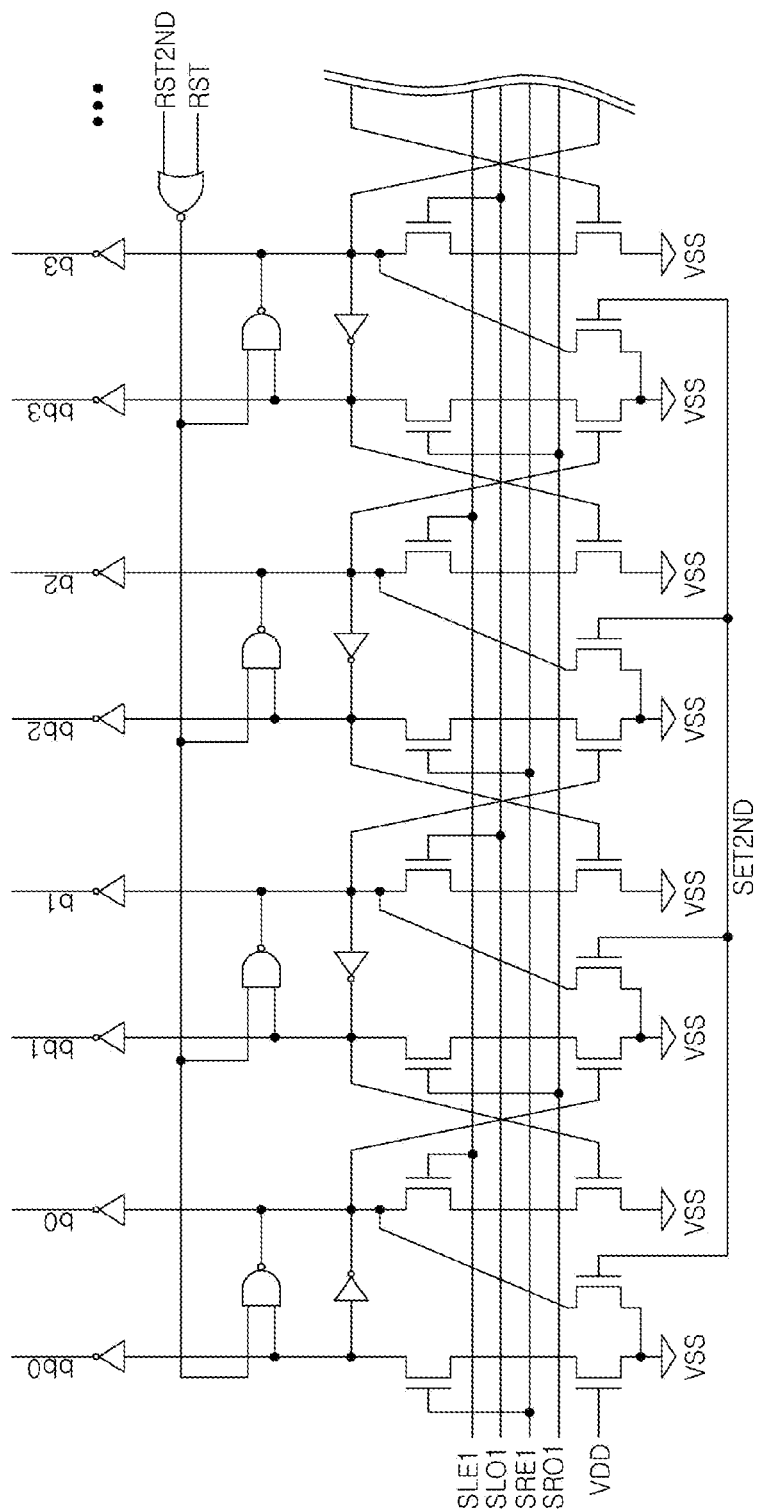
Figure 13C:
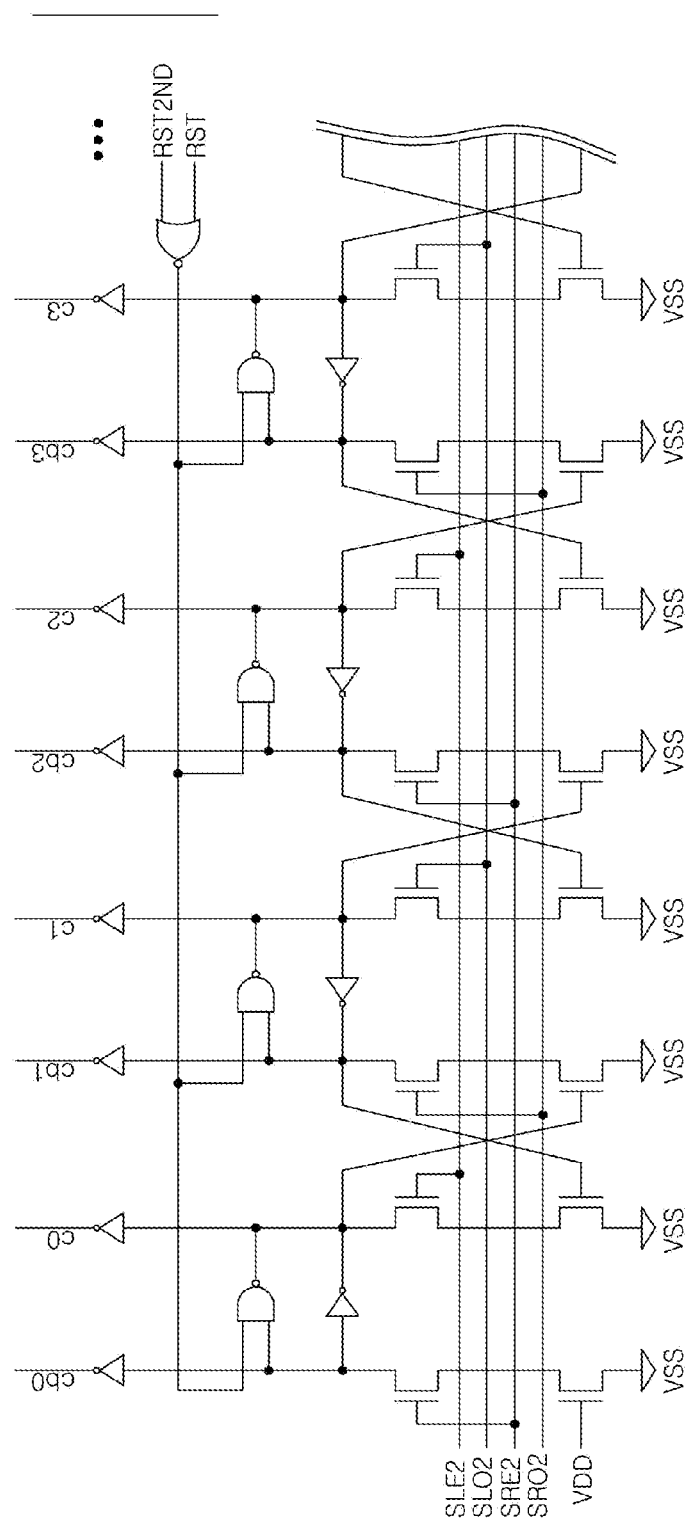

As illustrated in FIGS. 13A through 13C, the shift register 120 includes first through third shift register units, that is, a header 121 (see FIG. 13A), a bridge 122 (see FIG. 13B), and a normal 123 (see FIG. 13C).

The header 121 of FIG. 13A, the bridge 122 of FIG. 13B, and the normal 123 of FIG. 13C correspond respectively to the header 111, the bridge 112, and the normal 113 of the delay line 110 illustrated in FIG. 8.

That is, the header 121, the bridge 122, and the normal 123 of FIGS. 13A-13C are provided for controlling the header 111, the bridge 112, and the normal 113 illustrated in FIG. 8, respectively.

Referring to FIG. 13A, the header 121 is configured to shift the delay line control signals ab0 through a3 in response to the first shift control signals SLE1 through SRO1.

The header 121 outputs the delay line control signals ab0, ab1, ab2 and ab3 of logic high level when the loop change signal CHG2ND is activated to a logic high level.

The header 121 is reset as the reset signal RST is activated to a logic high level. That is, the delay line control signal a0 is changed to a logic high level, and the other delay line control signals a1, a2 and a3 are changed to a logic low level.

Referring to FIG. 13B, the bridge 122 is configured to shift delay line control signals bb0-bb3 through b0-b3 in response to the first shift control signals SLE1 through SRO1.

The bridge 122 outputs the delay line control signals b0, b1, b2 and b3 of logic high level when the second loop set signal SET2ND is activated to a logic high level.

The bridge 122 is reset when the reset signal RST or the second loop reset signal RST2ND is activated to a logic high level. That is, the delay line control signals b0, b1, b2 and b3 are changed to a logic low level.

Referring to FIG. 13C, the normal 123 is configured to shift delay line control signals cb0-cb3 through c0-c3 in response to the second shift control signals SLE2 through SRO2.

The normal 123 is reset when the reset signal RST or the second loop reset signal RST2ND is activated to a logic high level. That is, the delay line control signals c0, c1, c2 and c3 are changed to a logic low level.

Figures 14, 15:
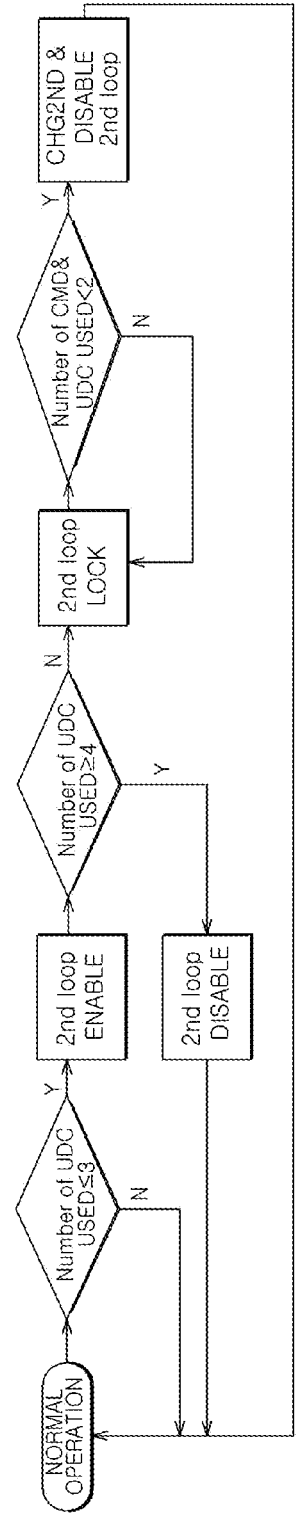
FIG. 14 is an operation timing diagram of the shift register shown in FIGS. 13A through 13C.
FIG. 15 is an operation flowchart of the delay locked loop shown in FIG. 7.

The operation of the shift register 120 illustrated in FIGS. 13A through 13C will be described below with reference to FIG. 14.

In a normal operation, the delay line control signals a0 through a6 of logic high level are generated according to the operation of the first loop 200.

The delay time of the header 111 is increased in response to the delay line control signals a0 through a6 of logic high level (see FIG. 8), thereby achieving the primary locking.

When the second loop set signal SET2ND is generated in response to the activation of the second loop enable signal 2NDEN, the delay line control signals b0 through b3 are changed to a logic high level and the second delay signal OUT2 is outputted.

The delay line control signals c0 through c4 of logic high level are generated according to the operation of the second loop 300.

The delay line of the normal 113 is increased in response to the delay line control signals c0 through c4 of logic high level, thereby achieving the secondary locking.

The secondary locking is to synchronize the phase of the second delay signal OUT2 with the phase of the first delay signal OUT1 at a delay time difference of 1tCK.

After the secondary locking, when the delay time of the header 111 is reduced to the minimum time, that is, only one unit delay cell is used (a0=H, a1 through a7=L), the loop change signal CHG2ND is generated.

When the loop change signal CHG2ND is generated, the delay line control signals a0 through a7 are changed to a logic high is level.

The operation of the synchronization circuit 110 according to an embodiment of the present invention will be described below with reference to FIGS. 8 and 15.

The delay locked loop 100 uses a dual locking scheme that basically achieves the primary locking having tDL corresponding to tCK−tREP, and achieves the final locking through the secondary locking in a specific condition. The specific condition refers to the condition in which a level of a power supply voltage (e.g., VDD) supplied to the semiconductor circuit is lowered, and accordingly the delay time of the replica delay 210, that is, tREP, is increased to thereby cause errors in the primary locking operation.

In the normal operation, the number of the unit delay cells of the header 111 is increased to perform the primary locking operation.

As the level of the power supply voltage is lowered, the number of the unit delay cells used in the header 111 becomes n (e.g., 3), the second loop 300 is enabled.

The number of the unit delay cells used in the header becomes minimal, that is, 1, there are no unit delay cells to be reduced. Thus, errors may occur in the locking operation. Therefore, by enabling the second loop 300 in advance, the number of the unit delay cells used in the whole delay line 110 is made to be n or more.

As the second loop 300 is enabled, the number of the unit delay cells of the normal 113 is increased to perform the secondary is locking operation.

The level of the power supply voltage may rise to the normal level. Therefore, it is determined whether or not the number of the unit delay cells used in the header 111 is increased to m (e.g., 4) or more.

If the number of the unit delay cells used in the header 111 is increased to 4 or more, the second loop 300 is disabled.

If the number of the unit delay cells used in the header 111 is equal to or less than 3, the number of the unit delay cells of the normal 113 is continuously increased to complete the secondary locking.

Then, if the number of the unit delay cells used in the header 111 becomes minimal, that is, 1, the loop change signal CHG2ND is generated in response to the auto refresh command, that is, the auto refresh signal AREF generated according to the auto refresh command. As the loop change signal CHG2ND is generated, the delay time of the delay line 110 is set to the time according to the secondary locking of the secondary locking of the second loop 300, not the first loop 200. In addition, as the loop change signal CHG2ND is generated, the second loop enable signal 2NDEN is deactivated.

As the second loop enable signal 2NDEN is deactivated, the output of the second delay signal OUT2 is blocked. An internal delay signal of the delay line 110 whose phase is synchronized with that of the first delay signal OUT1 at a delay time difference of 1tCK by the secondary locking is outputted as the first delay signal OUT1.

The delay time according to the secondary locking of the second loop 300 controls the delay line 110, and the first loop 200 performs the primary locking operation.

In various embodiments of the present invention, even though the data output latency coping with the variation in the locking point of the delay locked loop, as well as the latency defined in the operation specification, is controlled to thereby achieve the accurate control of the data output latency.

While certain embodiments have been described above, it will be understood to those skilled in the art that the embodiments described are by way of example only. Accordingly, the latency control circuit and method described herein should not be limited based on the described embodiments. Rather, the latency control circuit and method described herein should only be limited in light of the claims that follow when taken in conjunction with the above description and accompanying drawings.

What is claimed is:

1. A latency control circuit comprising:
    a delay locked loop (DLL) configured to generate a DLL clock signal by delaying a clock signal with a delay time varied according to one of dual locking points, and generates a loop change signal according to a locking point change between the dual locking points;
    a control unit configured to generate a latency control signal in response to a reset signal, a delay signal generated by delaying the reset signal by a first delay time, and the loop change signal; and
    a latency signal generation unit configured to adjust a latency of a command signal in response to the latency control signal and output a latency signal.

2. The latency control circuit according to claim 1, wherein the control unit is configured to generate the latency control signal in response to the reset signal, the delay signal, a CAS latency, and the loop change signal, and adjust a value of the latency control signal in response to the loop change signal.

3. The latency control circuit according to claim 1, wherein the control unit is configured to output a difference value of a counting pulse and a CAS latency as the latency control signal, and wherein the counting pulse includes a pulse of the clock signal and a pulse of the loop change signal, which are included in a phase difference period of the reset signal and the delay signal.

4. The latency control circuit according to claim 1, wherein the control unit comprises:
    a delay circuit configured to delay the reset signal by the first delay time and generate the delay signal;

a pulse generation section configured to output the clock signal and the loop change signal, which is included in the phase difference period of the reset signal and the delay signal, as a counting pulse;

a counter configured to count the counting pulse and output a latency adjustment signal; and a subtractor configured to subtract a value of the latency adjustment signal from a CAS latency value and output the latency control signal.

5. The latency control circuit according to claim 4, wherein the delay circuit comprises:

a delay line configured to set a delay time equal to a delay time of the delay locked loop; and a replica delay configured to delay an output signal of the delay line by the set delay time.

6. The latency control circuit according to claim 1, wherein the latency signal generation unit comprises:

a delay line configured to delay the command signal by a delay time equal to a delay time of the delay locked loop; and a shift register configured to shift an output signal of the delay line in response to the DLL clock signal and the latency control signal, and generate the latency signal.

7. The latency control circuit according to claim 1, wherein the delay locked loop comprises:

a delay line; and a first loop and a second loop configured to share the delay to line, wherein the second loop is enabled when the number of unit delay cells used in the delay line in a primary locking operation using the first loop is equal to or less than a set number.

8. The latency control circuit according to claim 7, wherein when the number of the unit delay cells used in the delay line becomes minimal, the second loop is configured to set the delay time of the delay line to a time given according to a secondary locking operation and generate the loop change signal.

9. The latency control circuit according to claim 7, wherein the second loop is configured to be enabled or disabled according to the number of the unit delay cells used in the delay line.

10. The latency control circuit according to claim 7, wherein the delay line comprises:

a first delay line configured to delay the clock signal in a delay locking operation of the first loop and generate a first delay signal;

a second delay line configured to activate an output of the second delay signal in a delay locking operation of the second loop; and a third delay line configured to delay the clock signal in the delay locking operation of the second loop and generate the second delay signal.

11. The latency control circuit according to claim 10, further comprising a shift register configured to share the first loop and the second loop and control the delay line.

12. The latency control circuit according to claim 11, wherein the shift register comprises:

a first shift unit configured to control the first delay line;

a second shift unit configured to control the second delay line; and a third shift unit configured to control the third delay line.

13. The latency control circuit according to claim 1, wherein the delay locked loop comprises:

a delay line configured to delay the clock signal by a set time in response to a delay line control signal and generate a first delay signal or a second delay signal;

a shift register configured to generate the delay line control signal in response to a first shift control signal, a second shift control signal, and a state control signal;

a first loop configured to generate the first shift control signal in response to the clock signal and a feedback signal; and a second loop configured to generate the second shift control signal and the state control signal in response to the first delay signal, the second delay signal, and the delay line control signal.

14. The latency control circuit according to claim 13, wherein the delay line comprises:

a first delay line configured to delay the clock signal in the operation of the first loop and generate the first delay signal;

a second delay line configured to activate an output of the second delay line in the operation of the second loop; and a third delay line configured to delay the clock signal in the operation of the second loop and generate the second delay signal.

15. The latency control circuit according to claim 13, wherein the state control signal comprises a second loop set signal, a second loop reset signal, and a loop change signal.

16. The latency control circuit according to 15, wherein the shift register comprises:

a first shift unit configured to generate the delay line control signal in response to the first shift control signal and the loop change signal;

a second shift unit configured to generate the delay line control signal in response to the first shift control signal, the second loop set signal, and the second loop reset signal; and a third shift unit configured to generate the delay line control signal in response to the second shift control signal and the second loop reset signal.

17. The latency control circuit according to claim 13, wherein the first loop comprises:

a replica delay configured to delay the first delay signal by a delay time given by modeling a delay time of a data output path of a semiconductor circuit, and generate a feedback signal;

a phase detection unit configured to compare a phase of the clock signal with a phase of the feedback signal and generate a first phase detection signal; and a first loop control unit configured to generate the first shift control signal in response to the first phase detection signal and the clock signal.

18. The latency control circuit according to claim 13, wherein the second loop comprises:

a phase detection unit configured to compare a phase of the first delay signal with a phase of the second delay signal and generate a phase detection signal; and a second loop control unit configured to generate the second shift control signal and the state control signal in response to the clock signal, the phase detection signal, the delay line control signal, and the first shift control signal.

19. The latency control circuit according to claim 18, wherein the second loop control unit is configured to the first shift control signal as the second shift control signal when the second loop is not enabled.

20. The latency control circuit according to claim 18, wherein the second loop control unit is configured to generate the state control signal for changing the delay time of the delay line to a delay time corresponding to the second shift control signal in response to the delay line control signal, a delay locking signal, and a non-read series command.

21. The latency control circuit according to claim 20, wherein the non-read series command comprises an auto refresh command.

22. The latency control circuit according to claim 18, wherein the second loop control unit comprises:
- a decoder configured to generate an auxiliary shift signal in response to the phase detection signal and the clock signal;
- a state machine configured to generate a second loop enable signal and the state control signal in response to the delay line control signal, a delay locking signal, and a non-read series command; and
- a multiplexer configured to select one of the first shift control signal and the auxiliary shift signal in response to the second loop enable signal and output the second shift control signal.

23. A latency control method using a delay locked loop configured to operate according to a dual locking point and generate a loop change signal according to a locking point change, the latency control method comprising:
- setting a latency value according to a reset signal, a delay signal generated by delaying the reset signal by a set time, and a loop change signal; and
- adjusting a latency of a command signal according to the latency value.

24. The latency control method according to claim 23, wherein the adjusting of the latency comprises:
- operating the latency value according to a phase difference of the reset signal and the delay signal.

25. The latency control method according to claim 24, further comprising:
- adjusting the latency value determined according to the phase difference of the reset signal and the delay signal, wherein the latency value is adjusted according to the loop change signal.

26. The latency control method according to claim 24, further comprising:
- adjusting the latency value determined according to the phase difference of the reset signal and the delay signal, wherein the latency value is adjusted according to a CAS latency.

27. The latency control method according to claim 23, wherein the set time comprises a delay time of the delay locked loop.

* * * * *